United States Patent [19]

Baurand et al.

[11] Patent Number: 4,709,205

[45] Date of Patent: Nov. 24, 1987

[54] INDUCTIVE SENSOR FOR CURRENT MEASUREMENT

[75] Inventors: Gilles Baurand, Montesson; René Fouret, Rueil Malmaison; Marek Rundsztuk, Enghien-Les-Bains, all of France

[73] Assignee: La Telemecanique Electrique

[21] Appl. No.: 877,949

[22] Filed: Jun. 24, 1986

[30] Foreign Application Priority Data

Jun. 28, 1985 [FR] France ............................ 85 09864

[51] Int. Cl.⁴ .......................................... G01R 19/00
[52] U.S. Cl. .................................... 324/127; 336/92;
336/65; 336/84 C; 336/174
[58] Field of Search ............... 324/55, 117 R, 127, 324/149; 174/35 R; 336/65, 84 C, 92, 174, 234; 361/400

[56] References Cited

U.S. PATENT DOCUMENTS

| | | | |
|---|---|---|---|
| 2,079,697 | 5/1937 | Ranges | 336/92 |
| 2,469,162 | 5/1949 | Gehman et al. | 336/92 |
| 2,644,135 | 6/1953 | Scholl | 324/127 |
| 2,912,481 | 11/1959 | Backus et al. | 336/234 |
| 4,041,324 | 8/1977 | Tashiro | 174/35 R |
| 4,134,091 | 1/1979 | Rogers | 336/65 |
| 4,370,515 | 1/1983 | Donaldson | 174/35 R |
| 4,484,170 | 11/1984 | Wirth et al. | 336/65 |
| 4,507,709 | 3/1985 | Morris et al. | 361/400 |
| 4,623,865 | 11/1986 | Kiesel et al. | 336/174 |

FOREIGN PATENT DOCUMENTS

| | | |
|---|---|---|
| 2432919 | 2/1976 | Fed. Rep. of Germany ........ 324/55 |
| 0216547 | 12/1984 | Fed. Rep. of Germany ... 324/117 R |
| 0872909 | 2/1943 | France ................................. 336/65 |

OTHER PUBLICATIONS

"Instrument Transformers", by Westinghouse, 4/61, sect. 44-000, -120, -112.
"Magnetoresistive Current Sensor", by Bowen et al., IBM Tech. Disc. Bull., vol. 17, #3, 8/74, pp. 728-729.

Primary Examiner—Ernest F. Karlsen
Assistant Examiner—William J. Burns
Attorney, Agent, or Firm—William A. Drucker

[57] ABSTRACT

An inductive current measuring sensor is provided comprising several coils connected electrically in series and disposed in a polygonal contour, so as to surround the conductor on which it is desired to measure the current. Each coil comprises windings disposed on an insulating bobbin and connection elements. The bobbins are disposed on the face of a printed circuit having a central recess through which the conductor may pass. The printed circuit carries conducting tracks interconnecting the fixing points of the connection elements together and to external connection members.

3 Claims, 7 Drawing Figures

INDUCTIVE SENSOR FOR CURRENT MEASUREMENT

BACKGROUND OF THE INVENTION

1. Field of the Invention

The present invention relates to an inductive sensor for current measurement, particularly of the type comprising several Rogowski coils connected electrically together in series disposed in a polygonal contour so as to surround the conductor on which it is desired to effect the current reading.

2. Description of the Prior Art

The FR Pat. No. 2 507 811 describes such an inductive current sensor having several Rogowski coils disposed in a square or a rectangle in a case, the bobbins of the coils being either independent or joined together by folding a single plastic material molded piece, and possibly surrounded by a protective shield not closed on itself. The sensor picks up a voltage induced in the coils, this voltage being a function linearly proportional to the derivative of the current which flows through it.

The invention starts from the discovery that such an inductive current sensor may be perfected in so far as its industrialization is concerned, particularly its mounting and connections. Its aim is more particularly to simplify the construction of an inductive current sensor, more particularly by facilitating the connection of the coils together and with an electronic processing circuit, this latter being possibly integrated with said sensor.

A further aim is to facilitate the assembly of the inductive sensor by the formation of a sensor subassembly comprising the coils and their supporting and connection means.

SUMMARY OF THE INVENTION

The invention relates to an inductive current measuring sensor, particularly of the type comprising several Rogowski coils connected electrically together in series and disposed in a polygonal contour so as to surround the power conductor-cable or bar -on which it is desired to make the current reading, each coil comprising layers or windings disposed on an insulating bobbin and elements for connection to an adjacent coil or to an external connection member.

According to the invention, the isolating bobbins of the coils are mounted on a first face of a printed circuit having a substantially central recess having dimensions predetermined as a function of the rating of the power conductor; the connection elements associated with each coil are fixed to the printed circuit, this latter having conducting tracks interconnecting the fixing points of the connection elements together or to external connection members.

The inductive sensor thus formed is particularly simple since the printed circuit provides both mechanical fixing of the coil bobbins and electric interconnection of the coils. The external connections may be made advantageously through the printed circuit on which are provided appropriate conducting tracks and external connection lugs soldered to the circuit.

Each coil includes either a winding with an even number of winding layers, in which case the connection elements are situated on the same side of the carcase, or a winding with an uneven number of winding layers, in which case the connection elements are situated on each side of the carcase. In the first case, the conducting tracks for interconnecting the connection elements of adjacent coils have a length substantially equivalent to that of the bobbins. In the second case, the printed circuit advantageously includes a neutralization conducting track substantially surrounding its central recess and disposed electrically in series and magnetically in opposition with the windings so as to neutralize the disturbing effects of the external magnetic fields.

An adjustment resistance may further be included on the printed circuit so as to allow calibration of the sensor so as to overcome manufacturing dispersions.

BRIEF DESCRIPTION OF THE DRAWINGS

Other features and advantages of the invention will be clear from the following description of one non limitative embodiment with reference to the accompanying drawings, in which.

DESCRIPTION OF THE PREFERRED EMBODIMENT

Figure 1:
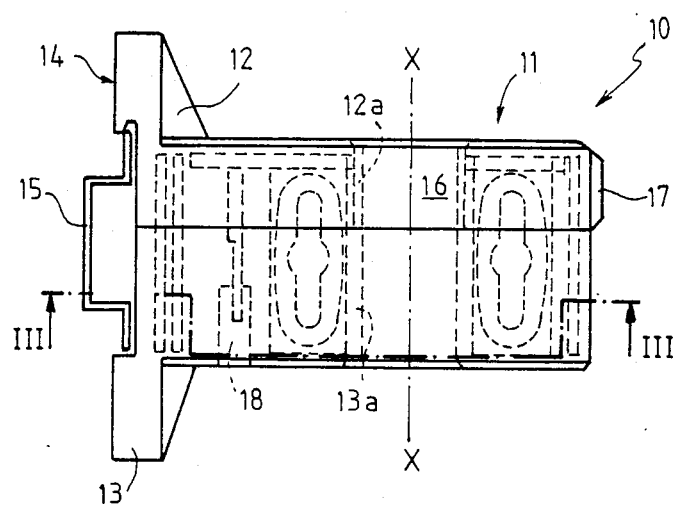
FIG. 1 shows in elevation an inductive currentsensor of the Rogowski girdle type in accordance with the invention.

The inductive current sensor 10 shown in FIG. 1 has a casing 11 which is formed of an upper case 12 and a lower case 13; the two cases 12, 13 fit mutually one in the other and are fixed for example by rivetting. The casing has a rear face 14 with elements for fixing to a support such as a rail 15 or a plate; it further has a through well 16 with vertical axis X—X parallel to the plane of the polygonal shaped face 14, in this case rectangular or square, with predetermined dimensions for passing therethrough the power conductor in the form of a cable or bar on which it is desired to make a current reading. The case is further equipped with a front locating door 17 and an opening 18 directed parallel to the axis X—X for connecting external conductors providing connection of the sensor with an associated electronic processing circuit.

Figure 2:
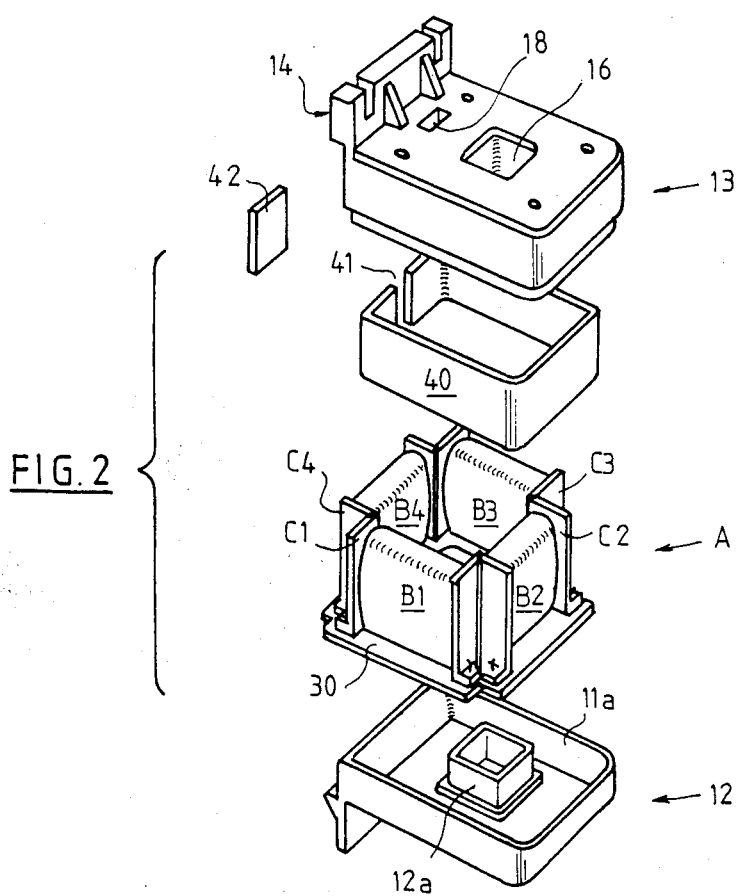
FIG. 2 shows an exploded top view in perspective of the sensor.
Figure 3:
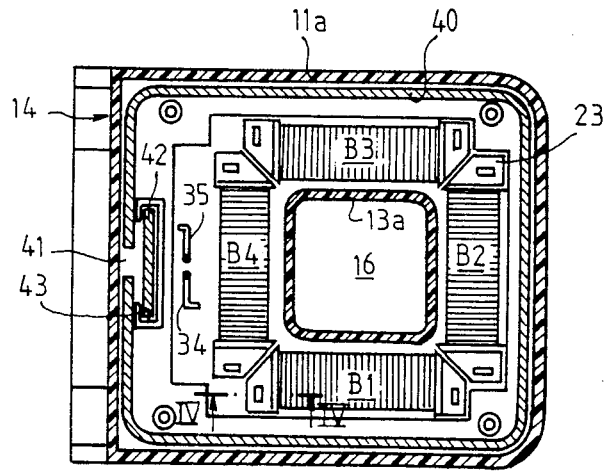
FIG. 3 is a sectional view through III—III of the sensor of FIG. 1.
Figure 4:
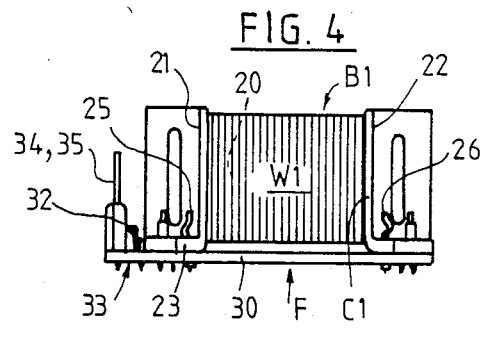
FIG. 4 shows in a side view the printed circuit carrying the coil bodies.
Figure 5:
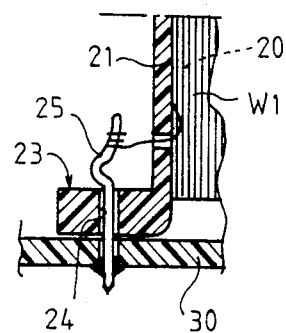
FIG. 5 is a partial enlarged section through line IV—IV of FIG. 3 showing the seating of a coil bobbin on the printed circuit.

As can be seen in FIG. 2, casing 11 houses a detection subassembly A formed by four coils identical two by two B1-B4 disposed in a rectangle or a square so as to form a Rogowski loop; the coils comprise layers of respective windings W1-W4 wound in an uneven number on isolating bobbins C1-C4. Each isolating bobbin is (FIGS. 3 and 4) in the form of a hollow core 20 fixed to side arresting walls 21, 22; each wall 21, 22 has a foot 23 in which is formed a through orifice 24 housing a connection barb 25, 26. The number of windings of each coil is uneven so that the current input and output of the coil take place close to the two opposite walls 21, 22. The feet 23 are bevelled at 45° for reducing as much as possible the spacing between adjacent coils (see FIGS. 2 and 3).

According to the invention, the coils B1-B4 are mounted on a printed circuit 30 of generally rectangular or square shape and have a central recess 31 of rectangular or square section slightly greater than that of the well 16 through which the power conductor passes.

The bobbins C1-C4 are disposed on a first face 32 of the printed circuit 30 so that the connection barbs 25, 26 may be fixed to the second face 33 of the printed circuit 30. This latter further has, on the same side as the coil bobbins, two external connecting lugs 34, 35 intended to be housed in the opening 18 and a calibrating resistor R. The barbs 25, 26 and lugs 34, 36 may be fixed by wave soldering.

The arrangement of the printed circuit will be explained further on with reference to FIGS. 6 and 7. The upper 12 and lower 13 cases of the casing have respectively sleeves 12a and 13a with a substantially rectangular or square contour, which fit mutually one in the other for determining internally the well 16 through which the power conductor passes and externally the housing for the sensor subassembly A with coils B1-B4 and printed circuit 30. The subassembly A is thus centered on the axis X—X by the central recess 31 of circuit 30 fitting onto one of the sleeves, whereas other conformations inside cases 12, 13 may also contribute to centering and holding the subassembly in position.

A shielding 40 is disposed in the casing 11 of the sensor 10; the external wall of shield 40 is in contact with the dividing wall 11a of the casing. This shield is open at 41 on the same side as the rear face 14 of the casing, whereas a complementary shielding element 42 is inserted opposite the opening 41 in shielding 40 in holding grooves 43 molded integrally with case 13.

Figure 6:
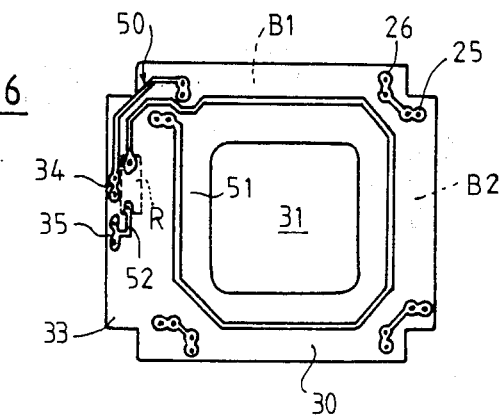
FIG. 6 is a view of the printed circuit in the direction of arrow F of FIG. 4.
Figure 7:
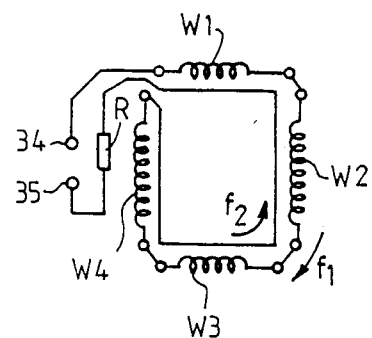
FIG. 7 shows the corresponding electric diagram.

The soldering face 33 of the printed circuit 30 has tracks such as shown in FIG. 6. The external connection lug 34 is connected by a track 50 formed onface 33 to the barb 25 of coil B1; the other barb 26 of coil B1 is connected by a soldering point to barb 25 of coil B2 and so on as far as barb 26 of coil B4 which is brased to a track 51 formed on the face 33 and passing round substantially the whole of the central recess 31 of the printed circuit 30, so as to have passing therethrough a current in a direction opposite the flow of the current in the coils (cf. arrows $f_1$ and $f_2$ in FIG. 7).

A calibrating or adjustment resistor R is connected on the one hand to track 51 and on the other to a track 52 connected to the second external connection lug 35.

It can be seen that assembling the sensor of the invention consists simply in housing the shielding in one of the cases, in positioning the subassembly, flowing a resin if required for providing a better resistance to shocks and vibrations of the sensor and rivetting the cases.

It goes without saying that modifications may be made to the embodiment described without departing from the scope of the invention. The inducting sensor illustrated comprises a Robowski loop, but may be formed by any other inductive current measuring sensor with interconnectable coils disposed in the form of a polygon having any number of sides. The printed circuit may include the electronic components for processing, that is to say particularly for amplifying and possibly integrating, the signal delivered by the sensor.

What is claimed is:

1. An inductive current measuring sensor for measuring the current flowing through a power conductor, said sensor comprising:
   i. a printed circuit board having first and second faces and a central recess with dimensions predetermined as a function of the power rating of said power conductor, first and second elongate conductive tracks on said first face, and first and second output terminals respectively connected to the first and second tracks at one end thereof;
   ii. a plurality of insulating bobbins mounted on said second face in a closed polygonal contour surrounding said central recess;
   iii. a plurality of Rogowski conductive coils mounted on the respective bobbins, said coils each having first and second terminals and being serially connected together from the first terminal of a first coil to the second terminal of a last coil, the first terminal of the first coil and the second terminal of the last coil being mounted across said printed circuit board and secured to the first face thereof, the first terminal of the first coil being connected to the first track at the opposite end thereof and the second terminal of the last coil being connected to the second track at the opposite end thereof.

2. A sensor as claimed in claim 1, wherein each coil has an uneven number of layers of windings and said second track surrounds said central recess substantially all along the length of said polygonal contour and the direction of current flow through said second track from said second terminal of the last coil to said second output terminal being opposite to the direction of current flow through the serially connected coils.

3. A sensor as claimed in claim 1, wherein said bobbins, coils and printed circuit board together form a substantially parallelepipedic assembly having a side outer surface, said sensor further comprising:
   iv. shielding means substantially completely surrounding said side outer surface, and
   v. an insulating casing, wherein said assembly and shield are housed, said casing including first and second removably assembled casing portions each having a bottom wall provided with a central opening and a central sleeve innerly projecting from the said central opening, said sleeves fitting together to define a well around which the printed circuit board central recess is fitted.

* * * * *